(12) United States Patent
Cok

(10) Patent No.: US 6,771,021 B2
(45) Date of Patent: Aug. 3, 2004

(54) LIGHTING APPARATUS WITH FLEXIBLE OLED AREA ILLUMINATION LIGHT SOURCE AND FIXTURE

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/156,396

(22) Filed: May 28, 2002

(65) Prior Publication Data

US 2003/0222559 A1 Dec. 4, 2003

(51) Int. Cl.$^7$ ................................................. H05B 33/12
(52) U.S. Cl. ......................... 313/512; 313/511; 362/84; 362/226
(58) Field of Search .............................. 313/238, 511, 313/512, 504; 362/84, 226

(56) References Cited

U.S. PATENT DOCUMENTS

| | | | |
|---|---|---|---|
| 4,626,742 A | * 12/1986 | Mental | ........................ 313/503 |
| 4,769,292 A | 9/1988 | Tang et al. | |
| 5,061,569 A | 10/1991 | VanSlyke et al. | |
| 5,903,102 A | * 5/1999 | Klappert et al. | ............ 313/512 |
| 6,246,169 B1 | * 6/2001 | Pruvot | ........................ 313/506 |
| 6,527,400 B2 | * 3/2003 | Dickie et al. | ................. 362/84 |

FOREIGN PATENT DOCUMENTS

| EP | 1 094 436 A2 | 4/2001 |
|---|---|---|
| WO | 99/57945 | 11/1999 |

OTHER PUBLICATIONS

Internet Article: Bergh, et al., "The Promise and Challenge of Solid–State Lighting," *Physics Today online*, vol. 54, Issue 12, Dec. 2001.

* cited by examiner

*Primary Examiner*—Ashok Patel
(74) *Attorney, Agent, or Firm*—Andrew J. Anderson; Thomas H. Close

(57) ABSTRACT

Lighting apparatus includes a solid-state area illumination light source, having: a planar flexible substrate, a flexible organic light emitting diode (OLED) layer deposited on the flexible substrate, the organic light emitting diode layer including first and second electrodes for providing electrical power to the OLED layer, a flexible encapsulating cover covering the OLED layer, and first and second conductors electrically connected to the first and second electrodes, and extending beyond the encapsulating cover for making electrical contact to the first and second electrodes by an external power source, whereby the light source may be stored in a space saving planar configuration; and a lighting fixture for removably receiving and holding the light source in a curved 3 dimensional configuration, the lighting fixture including a support for holding the light source in the curved configuration and contacts for providing electrical contact between said first and second conductors and an external power source.

65 Claims, 9 Drawing Sheets

US 6,771,021 B2

LIGHTING APPARATUS WITH FLEXIBLE OLED AREA ILLUMINATION LIGHT SOURCE AND FIXTURE

FIELD OF THE INVENTION

The present invention relates to the use of organic light emitting diodes for area illumination.

BACKGROUND OF THE INVENTION

Solid-state lighting devices made of light emitting diodes are increasingly useful for applications requiring robustness and long-life. For example, solid-state LEDs are found today in automotive applications. These devices are typically formed by combining multiple, small LED devices providing a point light source into a single module together with glass lenses suitably designed to control the light as is desired for a particular application (see, for example WO99/57945, published Nov. 11, 1999). These multiple devices are expensive and complex to manufacture and integrate into single area illumination devices. Moreover, LED devices provide point sources of light that are not preferred for area illumination.

Conventional illumination devices such as incandescent or fluorescent light bulbs are bulky, fragile, and problematic to handle and ship. Although the bulbs are filled with gas, the glass tubes are easily broken and occupy substantial space, especially in comparison to the actual light emitting area or material of the device. The bulbs must be carefully packed and require a large volume for shipping.

Existing solid-state lighting elements may be planar and hence easy and cost-effective to ship but do not address the need for lighting elements that have a variety of conventional three-dimensional shapes as found, for example, in light bulbs for decorative lighting. It is also useful if a lighting device is readily and safely replaced by consumers at minimal cost.

There is a need therefore for an improved, replaceable OLED area illumination device having a simple construction using a single substrate, is compatible with the existing lighting infrastructure, is efficient to ship, and provides a variety of three-dimensional shapes.

SUMMARY OF THE INVENTION

The need is met by providing lighting apparatus that includes a solid-state area illumination light source, having: a planar flexible substrate, a flexible organic light emitting diode (OLED) layer deposited on the flexible substrate, the organic light emitting diode layer including first and second electrodes for providing electrical power to the OLED layer, a flexible encapsulating cover covering the OLED layer, and first and second conductors electrically connected to the first and second electrodes, and extending beyond the encapsulating cover for making electrical contact to the first and second electrodes by an external power source, whereby the light source may be stored in a space saving planar configuration; and a lighting fixture for removably receiving and holding the light source in a curved 3 dimensional configuration, the lighting fixture including a support for holding the light source in the curved configuration and contacts for providing electrical contact between said first and second conductors and an external power source.

ADVANTAGES

The present invention has the advantage of providing a lighting apparatus having a light source that can be stored efficiently in a planar configuration, thereby saving considerable storage space. Another advantage is that the planar flexible light sources are not fragile and can be packaged in thin, unpadded packaging.

It will be understood that the figures are not to scale since the individual layers are too thin and the thickness differences of various layers too great to permit depiction to scale.

DETAILED DESCRIPTION OF THE INVENTION

Figure 1:
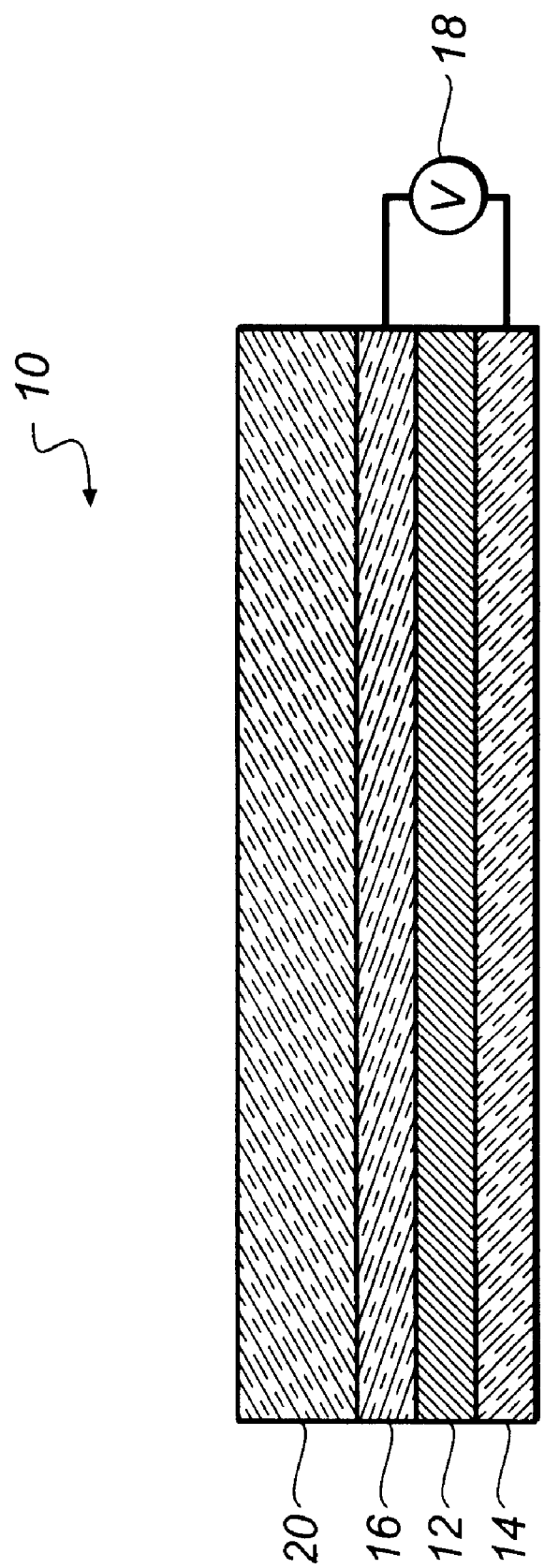
FIG. 1 illustrates a partial cross section of a prior art conventional OLED illumination device.

FIG. 1 is a schematic diagram of a prior art OLED light source 10 including an organic light emitting layer 12 disposed between two electrodes, e.g. a cathode 14 and an anode 16. The organic light emitting layer 12 emits light upon application of a voltage from a power source 18 across the electrodes. The OLED light source 10 typically includes a substrate 20 such as glass or plastic. It will be understood that the relative locations of the anode 16 and cathode 14 may be reversed with respect to the substrate. The term OLED light source refers to the combination of the organic light emitting layer 12, the cathode 14, the anode 16, and other layers described below.

Figure 2:
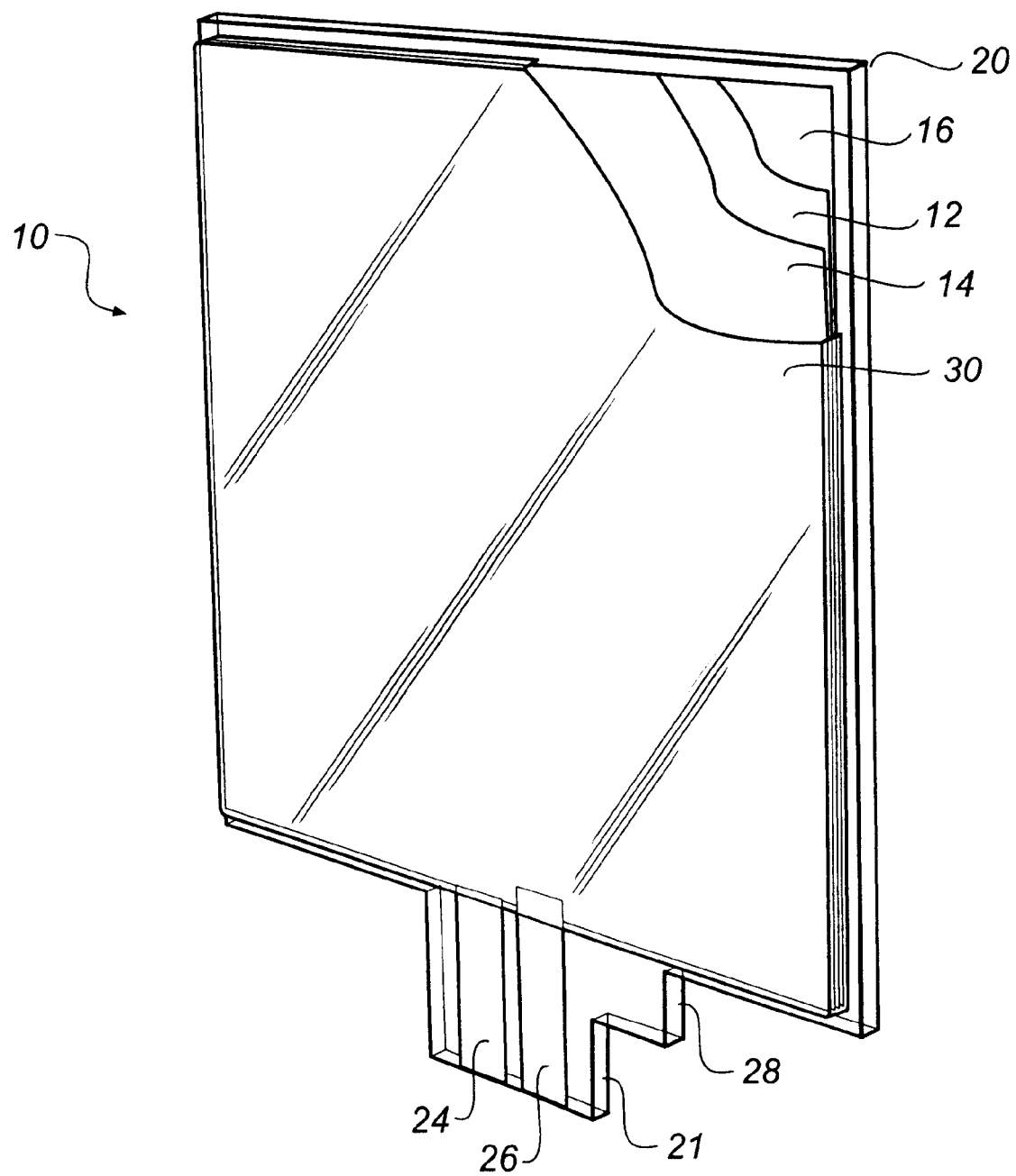
FIG. 2 is a perspective view of a flexible area illumination light source, including a detail of the layer structure, according to one embodiment of the present invention.
Figure 3:
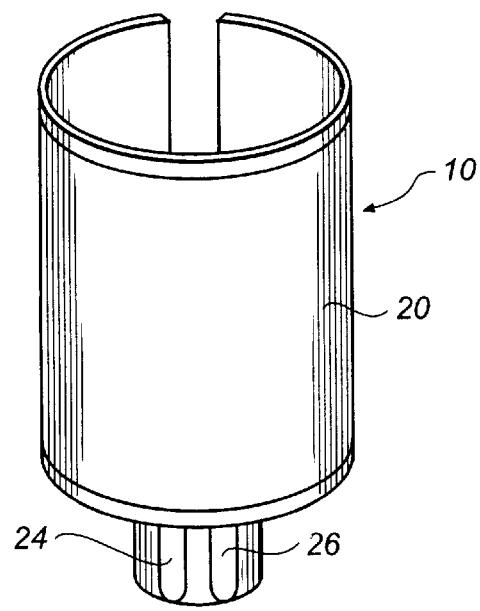
FIG. 3 is a perspective view of the flexible light source of FIG. 2 shown in a curved configuration.
Figure 4:
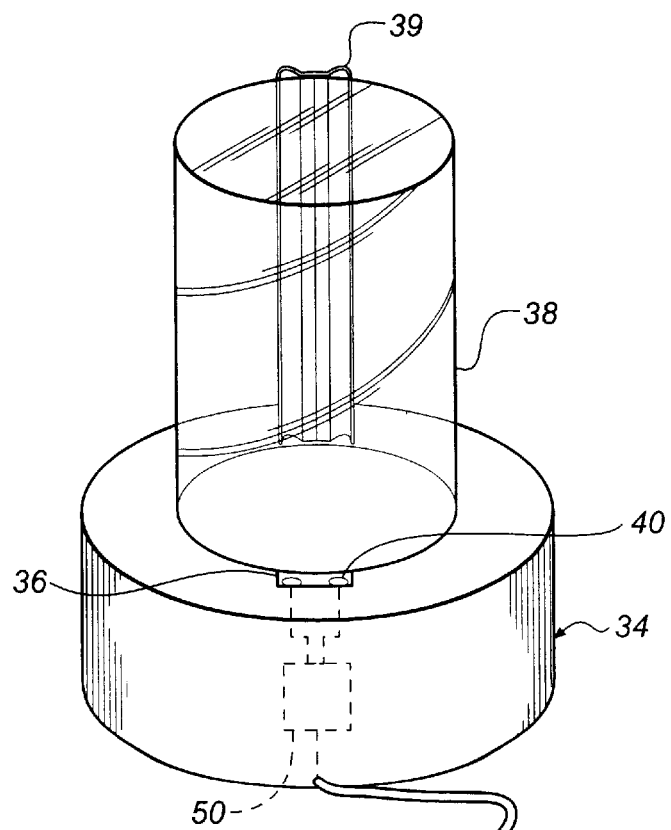
FIG. 4 is a perspective view of a lighting fixture for holding the light source of FIG. 3 in its curved configuration.

Referring to FIG. 2, a solid-state area illumination light source, includes a planar flexible substrate 20, a flexible organic light emitting diode (OLED) layer 12 deposited on the flexible substrate, the organic light emitting diode layer including first and second electrodes 14 and 16 for providing electrical power to the OLED layer, a flexible encapsulating cover 30 covering the OLED layer, first and second conductors 24 and 26 electrically connected to the first and second electrodes, and extending beyond the encapsulating cover 30 for making electrical contact to the first and second electrodes 14 and 16 by an external power source, whereby the light source may be stored in a space saving planar configuration. The encapsulating cover may be a coated layer or an additional layer of material affixed over the OLED layers and sealed at the edges of the devices. Light may be emitted either through the substrate or the cover, or both, if they are transparent. The OLED layers themselves are continuous over the substrate to form a single contiguous light-emitting area. As shown in FIG. 3, the flexible substrate 20 can be curved into a three dimensional form and, as shown in FIG. 4, inserted into an aperture 36 in a lighting fixture 34 for removably receiving and holding the light source 10 in a curved three-dimensional configuration. The lighting fixture includes a support 38 having clips 39 for holding the light source in the curved configuration, and contacts 40 within the aperture 36 for providing electrical contact between the first and second conductors and an external power source.

The support 38 may be transparent. In one embodiment of the present invention, the flexible substrate 20 can define a tab portion 21 that may include an orientation feature such as step 28 to insure that the light source is inserted in the fixture in the correct orientation. The tab portion 21 can be inserted into the aperture 36 of the fixture 34 and the light source 10 shaped around the support 38. Alternatively, additional contacts may be included in the aperture or on either side of the flexible substrate using conductive vias to provide electrical contact with the conductors regardless of the orientation in which the tab is inserted (not shown).

The flexible substrate 20 may be fastened to the support 38 with, for example, an adhesive, hook loop fasteners, or a mechanical restraint such as a clip or detent. In applications where it is not required to emit light from both sides of the substrate, one or more of the substrate, cover, anode, or cathode may be opaque or reflective. The light source 10 may be physically inserted into or removed from the fixture by pushing or pulling the substrate 20 into or out of the aperture 36.

Figure 5:
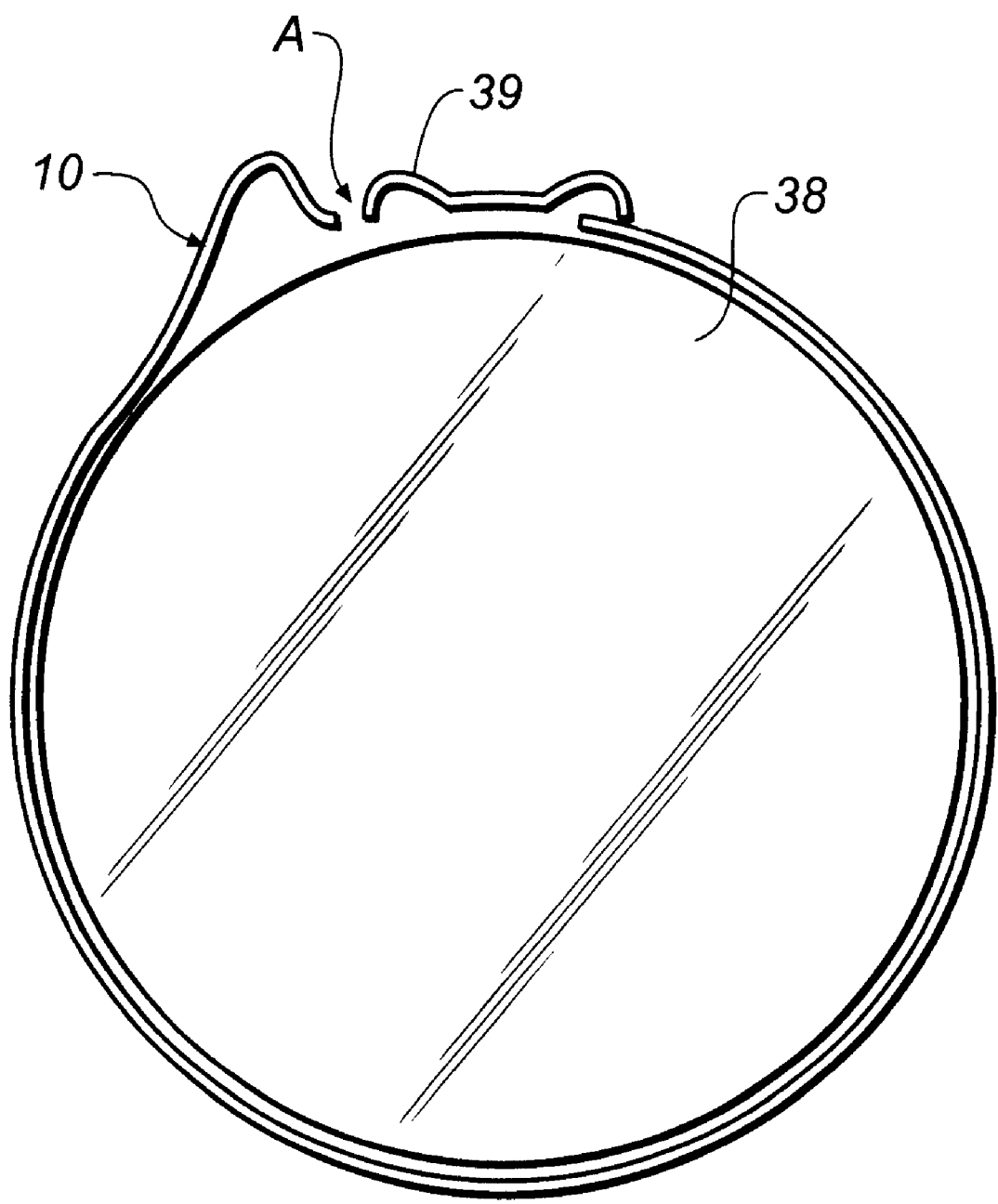
FIG. 5 is a top view of the lighting fixture and light source showing clips for holding the light source in the curved configuration.

FIG. 5 shows a top view of the support 38 with clips 39 for holding edges of the light source 10. To install the light source 10 in fixture 34, the tab portion 21 is first inserted into the aperture 36. Next, the light source 10 is wrapped around the support 38 and the edges of the flexible light source 10 are inserted under clips 39 as shown by arrow A.

Figure 6:
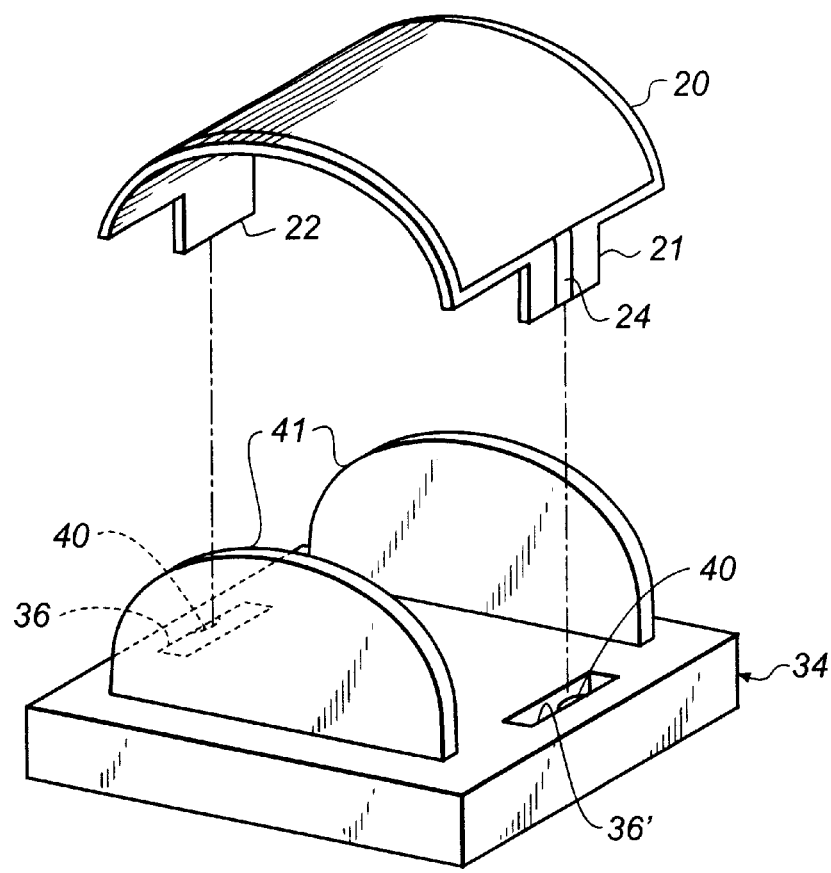
FIG. 6 is a perspective view of a light source and lighting fixture according to an alternative embodiment of the present invention.

Referring to FIG. 6, in another embodiment, the flexible substrate 20 may define two tabs 21 and 22. The first and second conductors 24 and 26 are each located on a respective tab portion and structured to fit into complementary apertures 36 and 36' in a fixture 34. The fixture 34 includes one or more fins 41 for supporting the flexible light source 10.

Figure 7:
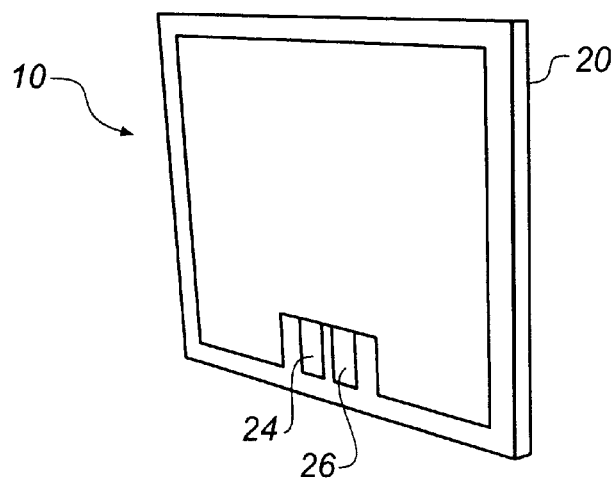
FIG. 7 is a perspective view of an alternative embodiment of a light source useable according to the present invention.
Figure 8:
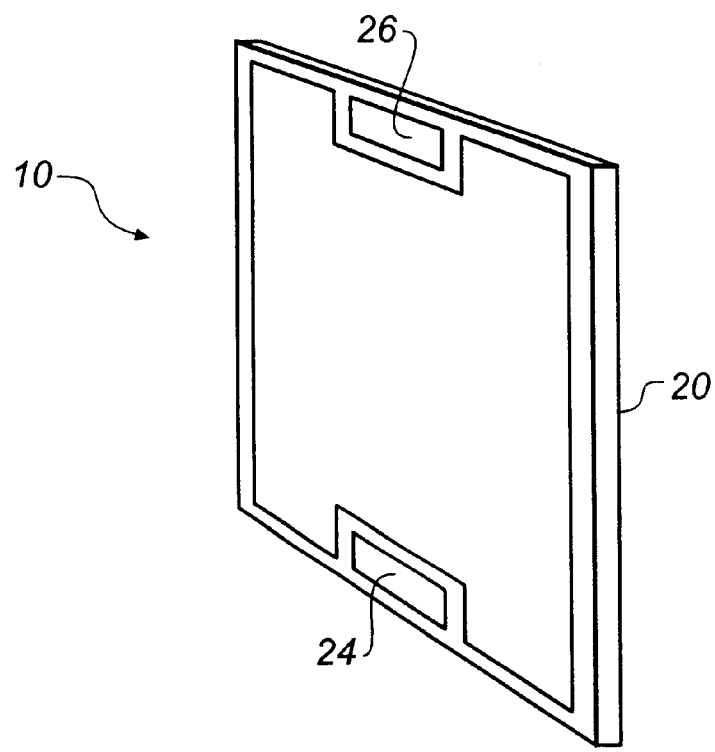
FIG. 8 is a perspective view of a further alternative embodiment of a light source useable according to the present invention.

Referring to FIG. 7 in a further embodiment, the substrate 20 does not define a physical protrusion but includes first and second conductors 24 and 26 located on an edge of the substrate 20. FIG. 8 illustrates an alternative arrangement wherein the first and second conductors 24 and 26 are at opposite edges of the substrate 20. In the embodiments shown in FIGS. 7 and 8, the apertures in the lighting fixture are wide enough to receive the entire edge of the substrate. Alternatively, the support can include clamps for holding two or more edges of the light source to bow the light source into a three-dimensional configuration, for example a cylindrical configuration. The contacts in the lighting fixture may be located in the clamps. A wide variety of other configurations are readily designed, including rings or conical sections.

Figure 9:
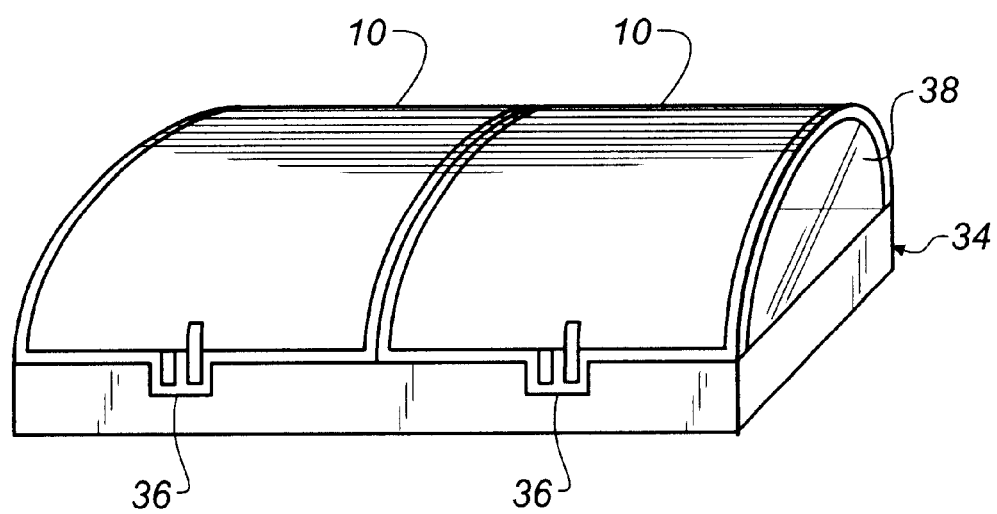
FIG. 9 is a perspective view of a lighting fixture holding a plurality of flexible light sources according to a further alternative embodiment of the present invention.

Referring to FIG. 9, an alternative fixture and support are shown wherein two light sources 10 are held in a common fixture 34. The half cylinder configurations shown in FIGS. 6 and 9 are useful, for example, for under-shelf lighting.

Figure 11:
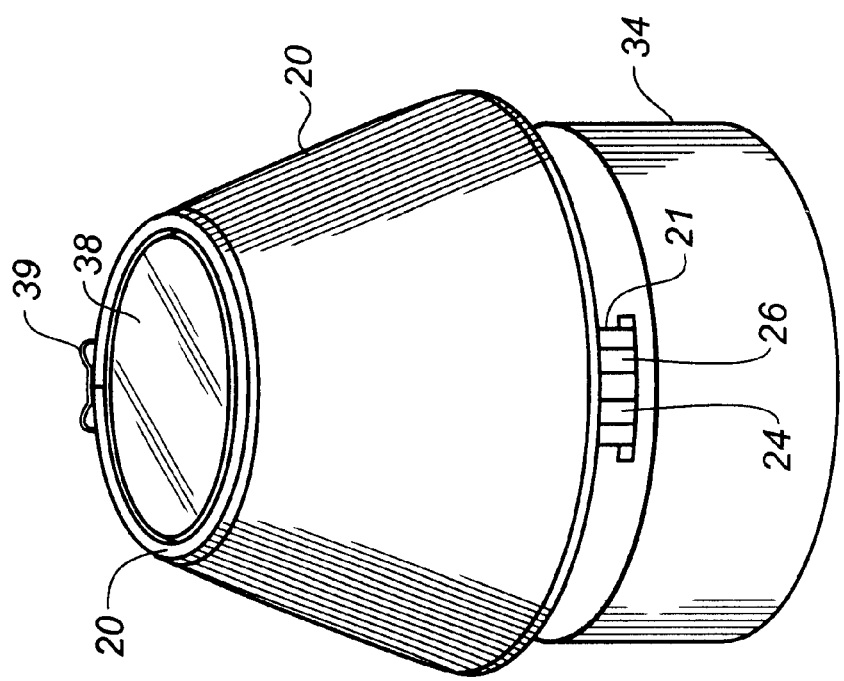
FIG. 11 is a perspective view of a light source held in a conical configuration according to the present invention.
Figure 10:
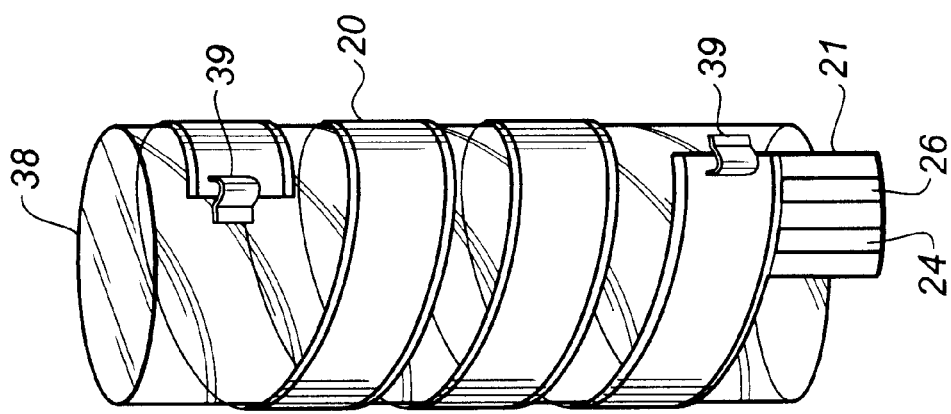
FIG. 10 is a perspective view of a light source held in a spiral configuration according to the present invention.

FIG. 10 illustrates another embodiment wherein the body of the light source 10 has an elongated rectangular shape and is held in a spiral configuration by the fixture 34. Clips 39 are provided at both ends of the spiral for holding the light source. FIG. 11 shows an embodiment wherein the light source 10 is held in the shape of a cone by fixture 34.

Referring to FIG. 4, the lighting fixture 34 can be adapted to connect the OLED light source 10 to an external power source (such as a standard household electrical grid, not shown). The fixture 34 may include power-conditioning circuitry 50 to convert the electrical power from the external power source to a form suitable for powering the OLED light source 10. For example, the OLED light source 10 may require a rectified voltage with a particular waveform and magnitude; the power conditioning circuitry can provide the particular waveform using conventional power control circuitry. The particular waveform may periodically reverse bias the light emitting organic materials to prolong the life time of the OLED materials. The fixture may also include a switch (not shown) for controlling the power to the light source.

The brightness of the light source 10 may be controlled by varying the power provided to the OLED. In particular, pulse-width modulation schemes well known in the art may be employed (see for example, EP1094436A2, published Apr. 25, 2001) and implemented by the power conditioning circuitry 50. Alternatively, the amount of power provided to the light emitting area may be reduced, for example by reducing the voltage or limiting the current supplied to the OLED. A brightness control switch may be integrated into the socket, for example with variable resistance switch formed. The power source may be standard 110 volt AC as found in North America, 220 volt AC as found in Europe, or other standard power configurations such as 24-, 12-, or 6-volt DC.

The OLED light source 10 can be provided as a standard element and fixtures 34 customized to markets with differing power systems. OLED light sources 10 may be provided with different shapes or other attributes useful in specific applications and may be employed with a common socket, thereby decreasing costs and improving usefulness of the lighting apparatus.

Figure 12:
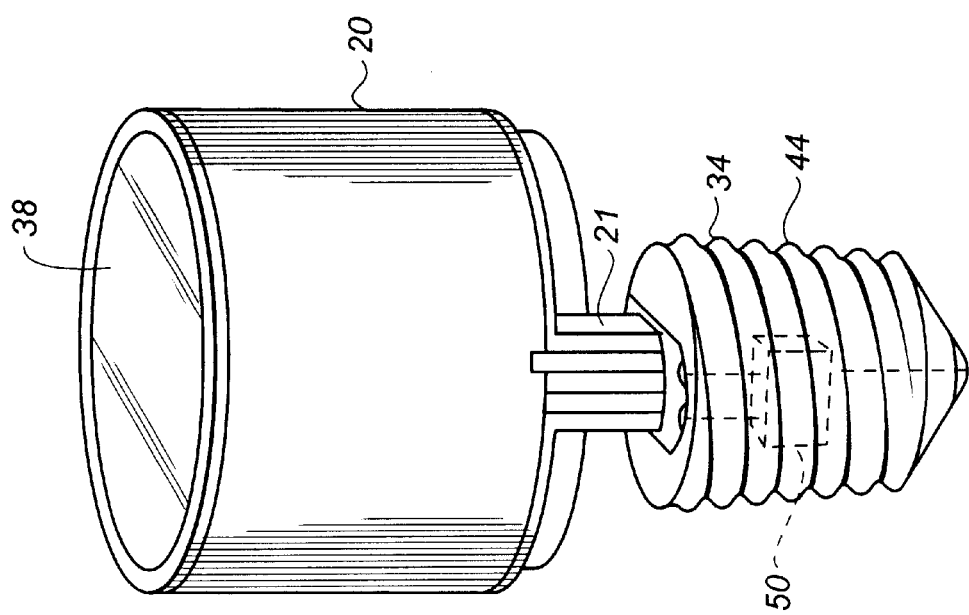
FIG. 12 is a perspective view of a light source and lighting fixture having a standard base.

Referring to FIG. 12, the lighting fixture 34 may include a support portion 38 and a standard light bulb base 44 such as a US standard screw type lamp base as shown in FIG. 12, or a pin-type base (not shown). A wide variety of standard lamp bases are known in the prior art and may be used with the fixture of the present invention.

Figure 13:
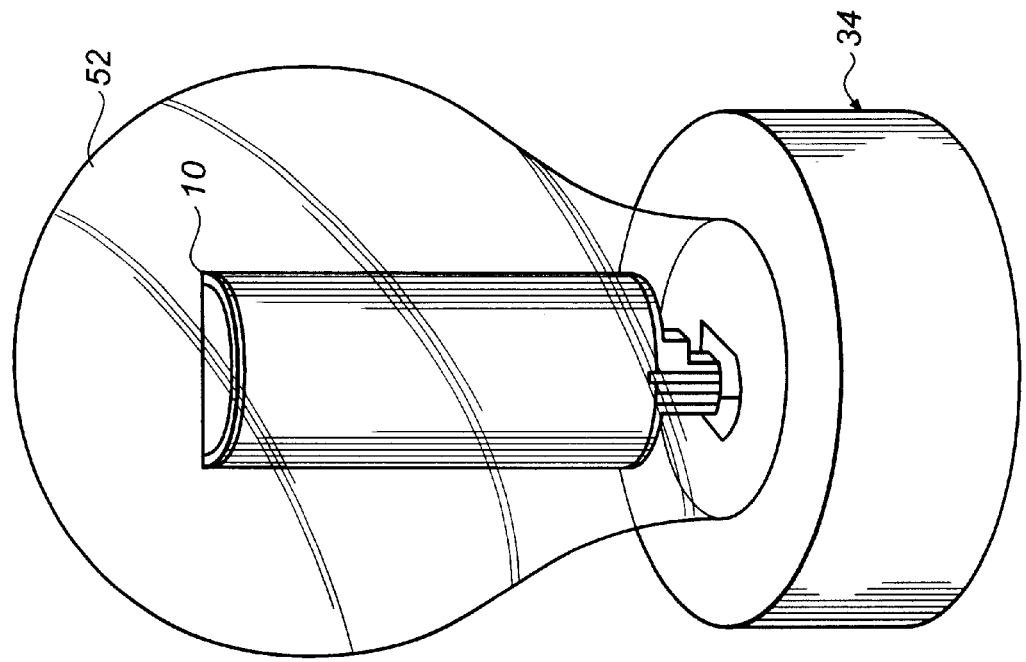
FIG. 13 is a perspective view of lighting apparatus according to the present invention including a light transmissive housing according to one embodiment of the present invention.

Referring to FIG. 13, a transparent or translucent screen or housing 52 may be provided around the OLED light source 10 to diffuse the light and provide additional physical protection and cosmetic appeal. The housing may take a variety of shapes, for example the shape of a standard light bulb.

Figure 14:
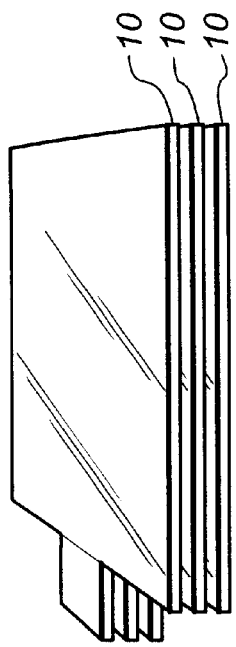
FIG. 14 is a perspective view of a stack of flexible light sources according to the present invention.

Referring to FIG. 14, the flexible light sources 10 may be stacked and packed in a planar configuration for compact storage and shipment. This compact packing arrangement significantly reduces the packing volume necessary for traditional bulbs and provides a robust, sturdy means for storing, transporting, and stocking the lighting light sources 10.

The present invention may be employed in a wide variety of conventional applications, for example in a table-top lamp, floor-lamp, ceiling lamp, or chandelier. The present invention may also be employed in portable illumination devices using DC power sources.

In a preferred embodiment, the Organic Light Emitting Diode layers (OLED layers) are composed of small molecule OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al.

OLED Element Architecture

Figure 15:
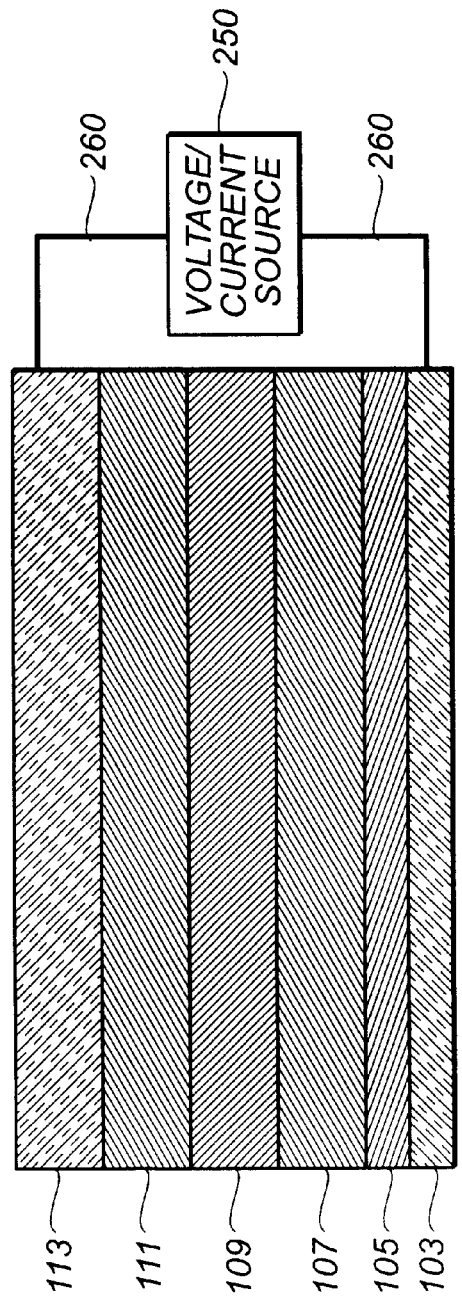
FIG. 15 is a cross sectional view of an OLED light source as known in the prior art.

There are numerous configurations of OLED elements wherein the present invention can be successfully practiced. A typical, non-limiting structure is shown in FIG. 15 and is comprised of an anode layer 103, a hole-injecting layer 105, a hole-transporting layer 107, a light-emitting layer 109, an electron-transporting layer 111, and a cathode layer 113. These layers are described in detail below. The total combined thickness of the organic layers is preferably less than 500 nm. A voltage/current source 250 is required to energize the OLED element and conductive wiring 260 is required to make electrical contact to the anode and cathode. The TFT layers and associated wiring serve these functions.

Substrate

Substrate 20 is preferably light transmissive but may also be opaque. Substrates for use in this case include, but are not limited to, very thin glass and plastics.

Anode

The anode layer 103 is preferably transparent or substantially transparent to the light emitted by the OLED layer(s). Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. When the anode is not transparent, the light transmitting characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

It is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520. A more preferred class of aromatic tertiary amines are those which include at least two aromatic tertiary amine moieties as described in U.S. Pat. Nos. 4,720,432 and 5,061,569. Illustrative of useful aromatic tertiary amines include, but are not limited to, the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]-p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Iridium complexes of phenylpyridine and its derivatives are particularly useful luminescent dopants. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar oxine derivatives constitute one class of useful host compounds capable of supporting electroluminescence, and are particularly suitable. Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-$\mu$-oxo-bis(2-methyl-8-quinolinolato)aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 111 and 109 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

Preferably, the cathode 113 is transparent and can comprise nearly any conductive transparent material. Alternatively, the cathode 113 may be opaque or reflective. Suitable cathode materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) and a thicker layer of conductive metal. The EIL is situated between the cathode and the organic layer (e.g., ETL). Here, the EIL preferably includes a low work function metal or metal salt, and if so, the thicker conductor layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When cathode layer 113 is transparent or nearly transparent, metals must be thin or transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357). While all organic layers may be patterned, it is most common that only the layer emitting light is patterned, and the other layers may be uniformly deposited over the entire device.

Optical Optimization

OLED layers used with this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the device, providing a polarizing medium over the device, or providing colored, neutral density, or color conversion filters over the device. Filters, polarizers, and anti-glare or anti-reflection coatings may be specifically provided over the cover or as part of the cover.

The invention has been described in detail with particular reference to certain preferred embodiments thereof, but it will be understood that variations and modifications can be effected within the spirit and scope of the invention.

| | |
|---|---|
| 10 | OLED light source |
| 12 | organic light emitting layer |
| 14 | cathode |
| 16 | anode |
| 18 | power source |
| 20 | substrate |
| 21 | tab portion of substrate |
| 22 | tab portion of substrate |
| 30 | encapsulating cover |
| 24 | first conductor |
| 26 | second conductor |
| 28 | step |
| 34 | lighting fixture |
| 36 | aperture |
| 36' | aperture |
| 38 | support |
| 39 | clip |
| 40 | contact |
| 41 | light source support fin |
| 44 | standard lamp base |
| 50 | power conditioning circuitry |
| 52 | light transmissive housing |
| 103 | anode |
| 105 | hole-injecting layer |
| 107 | hole-transporting layer |
| 109 | light-emitting layer |
| 111 | electron-transporting layer |
| 113 | cathode layer |
| 250 | voltage/current source |
| 260 | conductive wiring |

What is claimed is:

1. Lighting apparatus, comprising:
   a) a solid-state area illumination light source, having:
      i) a planar flexible substrate,
      ii) a flexible organic light emitting diode (OLED) layer deposited on the flexible substrate, the organic light emitting diode layer including first and second electrodes for providing electrical power to the OLED layer,
      iii) a flexible encapsulating cover covering the OLED layer, and
      iv) first and second conductors electrically connected to the first and second electrodes, and extending beyond the encapsulating cover for making electrical contact to the first and second electrodes by an external power source, whereby the light source may be stored in a space saving planar configuration; and
   b) a lighting fixture for removably receiving and holding the light source in a curved three-dimensional configuration, the lighting fixture including a support for holding the light source in the curved configuration and contacts for providing electrical contact between said first and second conductors and an external power source.

2. The lighting apparatus claimed in claim 1, wherein the curved configuration is cylindrical, spiral, or pyramidal.

3. The lighting apparatus claimed in claim 1, wherein the light source defines a body portion and one or more tab portions; the first and second conductors being located on the tab portion(s).

4. The lighting apparatus claimed in claim 3, wherein the tab portion(s) include an orientation feature for orienting the light source in a socket.

5. The lighting apparatus claimed in claim 3, wherein the first and second conductors are located on both sides of the tab portion, whereby the light source can be inserted into a socket in either of two orientations.

6. The lighting apparatus claimed in claim 5, wherein the light source defines tabs that are located at opposite edges of the substrate.

7. The lighting apparatus claimed in claim 1, wherein the first and second conductors are located at one or more edges of the light source.

8. The lighting apparatus claimed in claim 7, wherein the first and second conductors are located at opposite edges of the light source.

9. The lighting apparatus claimed in claim 1, wherein the light source emits light from one side of the flexible support and the first and second conductors are located on an opposite side.

10. The lighting apparatus claimed in claim 1, wherein the encapsulating cover is a coated layer.

11. The lighting apparatus claimed in claim 1, wherein the OLED layer is continuous over the substrate.

12. The lighting apparatus claimed in claim 1, wherein the light source operates on standard power.

13. The lighting apparatus claimed in claim 12, wherein the standard power is selected from the group consisting of 110 volt AC, 220 volt AC, 24 volt DC, 12 volt DC, and 6 volt DC.

14. The lighting apparatus claimed in claim 1, wherein the support is transparent.

15. The lighting apparatus claimed claim 1, further comprising a transparent or translucent housing surrounding the light source.

16. The lighting apparatus claimed in claim 1, further comprising a base adapted to be received by and make electrical contact with a standard electrical outlet.

17. The lighting apparatus claimed in claim 1, further comprising: a converter connected to the first and second conductors for converting power from the external power source to a form useable by the OLED layer.

18. The lighting apparatus claimed in claim 17, wherein the converter converts AC line voltage to a voltage useable by the OLED layer.

19. The lighting apparatus claimed in claim 1, further comprising a reflector for directing light from the light source.

20. The lighting apparatus claimed in claim 1, wherein the lighting apparatus is a ceiling lamp.

21. The lighting apparatus claimed in claim 1, wherein the lighting apparatus is a table lamp.

22. The lighting apparatus claimed in claim 1, wherein the lighting apparatus is a floor lamp.

23. The lighting apparatus claimed in claim 1, wherein the flexible substrate is transparent, and light is emitted from the OLED layer through the flexible substrate.

24. The lighting apparatus claimed in claim 1, wherein the encapsulating cover is transparent, and light is emitted from the OLED layer through the encapsulating cover.

25. The lighting apparatus claimed in claim 1, wherein the light source emits light from only one side of the substrate and further includes a reflective layer on the other side of the substrate.

26. The lighting apparatus claimed in claim 1, wherein the light source emits light through both the substrate and the encapsulating cover.

27. The lighting apparatus claimed in claim 1, wherein the light source has a rectangular shape and the support includes clamps for holding two edges of the light source to bow the light source into a cylindrical configuration.

28. The lighting apparatus claimed in claim 27, wherein the contacts are located in the clamps.

29. The lighting apparatus claimed in claim 1, wherein the light source has an elongated rectangular shape and the support includes a frame and clamps for holding the light source in a spiral configuration about the frame.

30. The lighting apparatus claimed in claim 29, wherein the contacts are located in the clamps.

31. The lighting apparatus claimed in claim 1, wherein the light source is has the shape of a ring segment, and the support includes clamps for holding the light source in a conical configuration.

32. The lighting apparatus claimed in claim 29, wherein the contacts are located in the clamps.

33. A method of providing lighting, comprising the steps of:
 a) providing a customer with a solid-state area illumination light source in a planar configuration, thereby saving storage space, the light source having:
  i) a planar flexible substrate,
  ii) a flexible organic light emitting diode (OLED) layer deposited on the flexible substrate, the organic light emitting diode layer including first and second electrodes for providing electrical power to the OLED layer,
  iii) a flexible encapsulating cover covering the OLED layer, and
  iv) first and second conductors electrically connected to the first and second electrodes, and extending beyond the encapsulating cover for making electrical contact to the first and second electrodes by an external power source, whereby the light source may be stored in a space saving planar configuration;
 b) providing a customer with a lighting fixture for removably receiving and holding the light source in a curved 3 dimensional configuration, the lighting fixture including a support for holding the light source in the curved configuration and contacts for providing electrical contact between said first and second conductors and an external power source; and
 c) the customer installing the planar light source in the lighting fixture.

34. The method claimed in claim 33, wherein a plurality of light sources are stacked and packed in planar configuration for compact storage and shipment.

35. The method claimed in claim 33, wherein the curved configuration is cylindrical, spiral, or pyramidal.

36. The method claimed in claim 33, wherein the light source defines a body portion and one or more tab portions; the first and second conductors being located on the tab portion(s).

37. The method claimed in claim 36, wherein the tab portion(s) include an orientation feature for orienting the light source in a socket.

38. The method claimed in claim 36, wherein the first and second conductors are located on both sides of the tab portion, whereby the light source can be inserted into a socket in either of two orientations.

39. The method claimed in claim 33, wherein the light source defines tabs that are located at opposite edges of the substrate.

40. The method claimed in claim 33, wherein the first and second conductors are located at one or more edges of the light source.

41. The method claimed in claim 40, wherein the first and second conductors are located at opposite edges of the light source.

42. The method claimed in claim 33, wherein the light source emits light from one side of the flexible substrate and the first and second conductors are located on an opposite side.

43. The method claimed in claim 33, wherein the encapsulating cover is a coated layer.

44. The method claimed in claim 33, wherein the OLED layer is continuous over the substrate.

45. The method claimed in claim 33, wherein the light source operates on standard power.

46. The method claimed in claim 45, wherein the standard power is selected from the group consisting of 110 volt AC, 220 volt AC, 24 volt DC, 12 volt DC, and 6 volt DC.

47. The method claimed in claim 33, wherein the support is transparent.

48. The method claimed in claim 33, further comprising a transparent or translucent housing surrounding the light source.

49. The method claimed in claim 33, further comprising a base adapted to be received by and make electrical contact with a standard electrical outlet.

50. The method claimed in claim 33, further comprising a converter connected to the first and second conductors for converting power from the external power source to a form useable by the OLED layer.

51. The method claimed in claim 50, wherein the converter converts AC line voltage to a voltage useable by the OLED layer.

52. The method claimed in claim 33, further comprising a reflector for directing light from the light source.

53. The method claimed in claim 33, wherein the lighting apparatus is a ceiling lamp.

54. The method claimed in claim 33, wherein the lighting apparatus is a table lamp.

55. The method claimed in claim 33, wherein the lighting apparatus is a floor lamp.

56. The method claimed in claim 33, wherein the flexible substrate is transparent, and light is emitted from the OLED layer through the flexible substrate.

57. The method claimed in claim 33, wherein the encapsulating cover is transparent, and light is emitted from the OLED layer through the encapsulating cover.

58. The method claimed in claim 33, wherein the light source emits light from only one side of the substrate and further includes a reflective layer on the other side of the substrate.

59. The method claimed in claim 33, wherein the light source emits light through both the substrate and the encapsulating cover.

60. The method claimed in claim 33, wherein the light source has a rectangular shape and the support includes clamps for holding two edges of the light source to bow the light source into a cylindrical configuration.

61. The method claimed in claim 60, wherein the contacts are located in the clamps.

62. The method claimed in claim 33, wherein the light source has an elongated rectangular shape and the support includes a frame and clamps for holding the light source in a spiral configuration about the frame.

63. The method claimed in claim 62, wherein the contacts are located in the clamps.

64. The method claimed in claim 33, wherein the light source has the shape of a ring segment, and the support includes clamps for holding the light source in a conical configuration.

65. The method claimed in claim 64, wherein the contacts are located in the clamps.

* * * * *

UNITED STATES PATENT AND TRADEMARK OFFICE
CERTIFICATE OF CORRECTION

PATENT NO. : 6,771,021 B2
DATED : August 3, 2004
INVENTOR(S) : Cok

It is certified that error appears in the above-identified patent and that said Letters Patent is hereby corrected as shown below:

Column 11,
Line 53, change "29" to -- 31 --.

Signed and Sealed this

Thirteenth Day of September, 2005

JON W. DUDAS
*Director of the United States Patent and Trademark Office*